(12) United States Patent
Ding et al.

(10) Patent No.: US 6,200,433 B1
(45) Date of Patent: Mar. 13, 2001

(54) IMP TECHNOLOGY WITH HEAVY GAS SPUTTERING

(75) Inventors: Peijun Ding; Rong Tao, both of San Jose; Barry Chin, Saratoga; Dan Carl, Pleasanton, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/430,998

(22) Filed: Nov. 1, 1999

(51) Int. Cl.[7] ............................ C23C 14/42; C23C 14/44; C23C 14/58
(52) U.S. Cl. .............................. 204/192.15; 204/192.12; 204/192.17; 204/192.22; 204/298.06; 204/298.08
(58) Field of Search ..................... 204/192.12, 192.15, 204/192.17, 192.22, 298.06, 298.08

(56) References Cited

U.S. PATENT DOCUMENTS

| | | | |
|---|---|---|---|
| 5,178,739 | * | 1/1993 | Barnes et al. ................... 204/192.12 |
| 5,281,554 | * | 1/1994 | Shimada et al. ................ 204/192.17 |
| 5,372,848 | | 12/1994 | Blackwell et al. .................... 427/250 |
| 5,633,199 | * | 5/1997 | Fiordalice et al. ................... 438/642 |
| 5,766,379 | * | 6/1998 | Lanford et al. ...................... 148/537 |
| 5,882,399 | * | 3/1999 | Ngan et al. ............................ 117/89 |
| 5,997,699 | * | 12/1999 | Leiphart .......................... 204/192.12 |
| 6,132,575 | * | 10/2000 | Pandumsoporn et al. ...... 204/298.06 |

* cited by examiner

Primary Examiner—Alan Diamond
(74) Attorney, Agent, or Firm—Thomason, Moser & Patterson

(57) ABSTRACT

The present invention generally provides a copper metallization method for depositing a conformal barrier layer and seed layer in a plasma chamber. The barrier layer and seed layer are preferably deposited in a plasma chamber having an inductive coil and a target comprising the material to be sputtered. One or more plasma gases having high molar masses relative to the target material are then introduced into the chamber to form a plasma. Preferably, the plasma gases are selected from xenon, krypton or a combination thereof.

10 Claims, 3 Drawing Sheets

IMP TECHNOLOGY WITH HEAVY GAS SPUTTERING

BACKGROUND OF THE INVENTION

1. Field of the Invention

The present invention relates to an apparatus and method for processing substrates. Specifically, the invention relates to a method for depositing conformal barrier layers and seed layers in an ionized metal plasma process.

2. Background of the Related Art

Sub-quarter micron multi-level metallization represents one of the key technologies for the next generation of ultra large-scale integration (ULSI) for integrated circuits (IC). In the fabrication of semiconductors and other electronic devices, directionality of particles being deposited is important in filling small features. As circuit densities increase, the widths of vias, contacts and other features have decreased to 0.25 μm or less, whereas the thicknesses of the dielectric layers remain substantially constant. Thus, the aspect ratios for the features, i.e., the ratio of the depth to the minimum lateral dimension, increases, thereby pushing the aspect ratios of the contacts and vias to 5:1 and above. As the dimensions of the features decrease, it becomes even more important to get directionality of the particles in order to achieve conformal coverage of the feature side walls and bottom.

Conventional physical vapor deposition (PVD) are not suited for directional deposition and, therefore, have difficulty penetrating and conformally lining the sidewalls and bottoms of structures where the aspect ratio exceeds 4:1. Thus, the uniformity and step coverage of the deposited layer will depend directly upon the structure architecture with the layer becoming thinner on the structure bottom and sidewall near the bottom. The uniformity and step coverage of the layer, and therefore the integrity of the layer, will be compromised by overhangs, voids and other undesirable formations in the device features.

To obtain deposition in the high aspect ratio features, one method uses a medium/high pressure physical vapor deposition (PVD) process known as an ionized metal plasma (IMP) process or high density plasma physical vapor deposition (HDP-PVD). The plasma density in IMP processes are typically between about $10^{11} cm^{-3}$ and $10^{12} cm^{-3}$. Generally, IMP processing offers the benefit of highly directional deposition with good bottom coverage in high aspect ratio structures. Initially, a plasma is generated by introducing a gas, such as helium or argon, into the chamber and then biasing a target to produce an electric field in the chamber, thereby ionizing a portion of the gas. An energized coil positioned proximate the processing region of the chamber couples electromagnetic energy into the plasma to result in an inductively-coupled medium/high density plasma between the target and a susceptor on which a substrate is placed for processing. The ions and electrons in the plasma are accelerated toward the target by the bias applied to the target causing the sputtering of material from the target. Under the influence of the plasma, the sputtered metal flux is ionized. An electric field due to an applied or self-bias, develops in the boundary layer, or sheath, between the plasma and the substrate that accelerates the metal ions towards the substrate in a direction substantially parallel to the electric field and perpendicular to the substrate surface. The bias energy is preferably controlled by the application of power, such as RF, to the susceptor to attract the sputtered target ions in a highly directionalized manner to the surface of the substrate to fill the features formed on the substrate.

The high density plasma of conventional HDP-PVD is typically achieved by operating at pressures between about 5–100 mTorr. It is believed that such pressures ensure thermalization and ionization of the sputtered metal particles. Thermalization refers to the slowing of the metal particles passing through the plasma by collisions with the plasma ions and must be sufficiently high to allow time for the coil to ionize the metal particles. Should the metal particles travel from the target to the substrate too quickly, the metal particles may not be ionized resulting in poor deposition rates and uniformity.

In an attempt to increase thermalization and ionization of the sputtered metal particles, it has been suggested to increase the chamber pressure, thereby increasing the plasma density. The higher plasma density, in turn, reduces the mean free path between particles, resulting in more collisions and increased ionization. However, above a certain pressure the deposition results are compromised. In particular, because of the greater number of collisions, the metal particles lose their initial directionality from the target and, in fact, may be back-scattered onto the target or other chamber components, thereby decreasing the deposition rate. Even those particles which continue toward the substrate may strike the device features at an angle oblique to the surface, despite the bias applied to the substrate, resulting in poor step coverage at the structure bottom and the side walls at the structure bottom.

Another problem related to higher operating pressures is the resulting low plasma potential. In order to bias ions toward the substrate for deposition thereon, a voltage, or potential, must be applied to the substrate. The voltage (V) is typically supplied by an RF or DC power supply, as described above, and is related to power (P) and current (I) according to V=P/I. As the plasma becomes denser at higher pressures, the current increases, thereby reducing the voltage applied to the substrate at a constant power level. To increase the voltage to a desired level, the power to the substrate must be increased. However, excessive power can damage the substrate by overheating, thereby preventing the power level from exceeding a critical value. Thus, the plasma density must be low enough to ensure a sufficiently high plasma potential and high bias on the substrate.

A different problem with conventional HDP-PVD is the emission profile, or directionality, of the sputtered target material from the target which, in part, determines the step coverage. Sputtering of the material from the target follows distribution patterns ranging from under-cosine to cosine to over-cosine. FIGS. 1–3 are typical under-cosine 10, cosine 12 and over-cosine emission profiles 14, respectively. Each of the emissions profiles 10, 12, 14 define the probability of a particle being sputtered from the target at a particular angle. Lines 16 emanating from arbitrary ejection point 18 indicate various ejection angles and the probability of a particle being ejected at that angle. The probability that an atom 15 will be sputtered from the target 17 at a specific angle is related to the length of the lines 16 originating at the ejection point 18. For example, in FIG. 1, the length of A is 1.3 times that of B, indicating the probability of the ejected atom 15 having trajectory 30 degrees relative to the plane of the target 17 (i.e., along the line B) is 0.77 times (1/1.3) that of the atom going out orthogonally (i.e., along line A). Thus, the overcosine emission profile 14 shown in FIG. 3 provides the greatest bottom coverage in high aspect ratios because of the greater normal or near-normal directionality from the target. Accordingly, the over-cosine emission profile 14 is most desirable for high aspect features.

Currently, the preferred plasma gases for HDP-PVD processes are argon (Ar) and helium (He) because of their low cost. While Ar and He have proven suitable for sputtering some target materials, such as Si, Ti/TiN and Al, Ar and He do not produce desirable emission profiles for other materials such tantalum (Ta), tungsten (W) and copper (Cu). Under optimal conditions, sputtering W in an Ar or He plasma produces only a cosine emission profile. The resulting cosine emission profile negatively impacts the coverage of device features. In particular the bottoms and lower sidewalls are not conformally covered with deposition material.

Therefore, there is a need for a method of depositing material on a substrate in an inductively-coupled plasma environment wherein the resulting layers exhibit good uniformity and step coverage.

SUMMARY OF THE INVENTION

The present invention generally provides a metallization method for depositing a uniform barrier layer and seed layer in a plasma chamber. In one embodiment, a substrate is positioned in a plasma chamber having a coil and a target comprising the material to be sputtered. One or more plasma gases are then introduced into the chamber to form a plasma having a density sufficient to ionize a portion of the sputtered material. The plasma gases are selected to have high molar masses relative to the target material and/or low ionization energies relative to conventional plasma gas(es). Preferably, the plasma gases are selected from xenon, krypton or a combination thereof. Where a barrier layer is deposited, the target preferably comprises tantalum, tantalum nitride, tungsten, tungsten nitride or titanium nitride. Where a seed layer is deposited, the target preferably comprises copper. Preferably, the barrier layer is deposited on a dielectric material having features formed therein and, subsequently, the seed layer is deposited on the barrier layer. The features are then filled with a conductive material, such as copper.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The embodiments described below use an ionized metal plasma (IMP) process that can be carried out using process equipment, such as an Endura® platform, available from Applied Materials, Inc., located in Santa Clara, Calif. The equipment preferably includes an integrated platform having a preclean chamber, an IMP-PVD barrier layer chamber, a PVD chamber, an IMP-PVD seed layer chamber and a CVD chamber. One ion metal plasma (IMP) processing chamber, known as an IMP VECTRA™ chamber is available from Applied Material Inc. of Santa Clara, Calif. Although the invention is preferably carried out in HDP-PVD processes, other processes may be used to advantage, when ionization of a material to be deposited is possible such as hollow cathode processes and electron cyclotron resonance processes.

Figure 4:
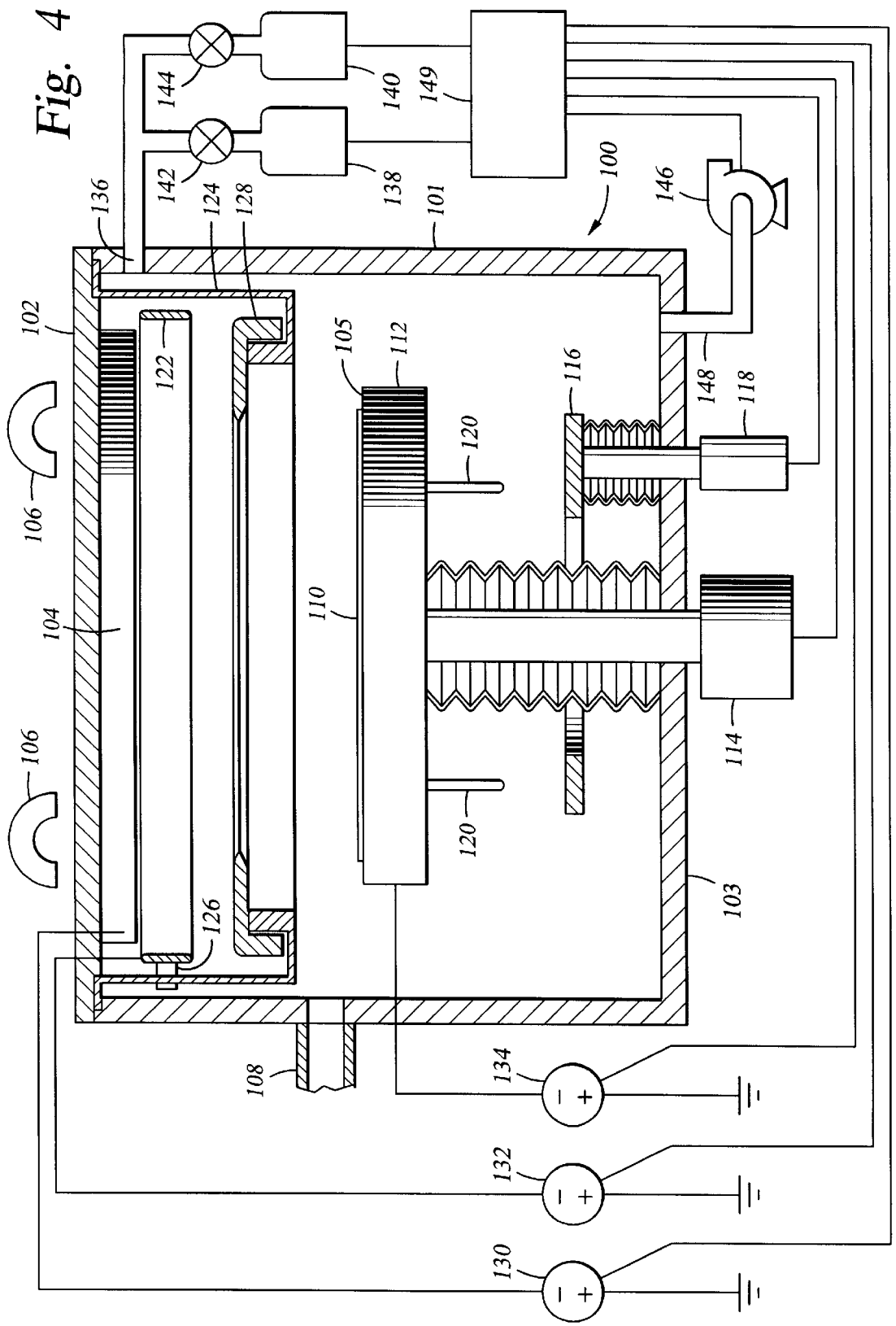
FIG. 4 is a diagram of a typical processing chamber using a coil.

FIG. 4 is a schematic cross-sectional view of an IMP chamber 100 that can be used to advantage with the present invention. The chamber 100 includes sidewalls 101, lid 102, and bottom 103. A target 104 comprising the material to be sputtered is disposed in the chamber 100 on the lid 102. A substrate support member 112 is movably disposed in the chamber 100 and provides an upper support surface 105 for supporting a substrate 110. The support member 112 is mounted on a stem connected to a lift motor 114 that raises and lowers the substrate support 112 between a lowered loading/unloading position and a raised processing position. An opening 108 in the chamber 100 provides access for a robot (not shown) to deliver and retrieve substrates 110 to and from the chamber while the substrate support member 112 is in the lowered loading/unloading position. A lift plate 116 connected to a lift motor 118 is mounted in the chamber 100 and raises and lowers pins 120 mounted in the substrate support. The pins 120 raise and lower the substrate 110 to and from the upper support surface 105 of the substrate support member 112. A shield 124 is disposed in the chamber to shield the chamber walls from the sputtered material. A coil 122 is preferably mounted to the shield 124 via supports 126 between the substrate support member 112 and the target 105 and provides inductive magnetic fields in the chamber to assist in generating and maintaining a plasma between the target 104 and substrate 110. The supports 126 electrically insulate the coil 122 from the shield 124 and the chamber 100. A clamp ring 128 is mounted between the coil 122 and the substrate support member 112 and shields an outer edge and backside of the substrate 110 from sputtered materials when the substrate 110 is raised into a processing position to engage the lower portion of the clamp ring 128.

Three power supplies are used in the chamber 100. A first power source 130 delivers either RF or DC power to the target 104 to cause the processing gas to form a plasma. Magnets 106 disposed behind the lid 102 form magnetic field lines at the target surface which trap electrons and increase the density of the plasma adjacent to the target 104 in order to increase the sputtering efficiency. A second power source 132, preferably a RF power source, supplies electrical power in the megahertz range to the coil 122 to increase the density of the plasma. A third power source 134, preferably a RF or a DC power source, biases the substrate support member 112 with respect to the plasma and provides directional attraction of the ionized sputtered material toward the substrate 110.

One or more plasma gases are supplied to the chamber 100 through a gas inlet 136 from gas sources 138, 140 as metered by respective mass flow controllers 142, 144. One or more vacuum pumps 146 are connected to the chamber 100 at an exhaust port 148 to exhaust the chamber 100 and maintain the desired pressure in the chamber 100. Preferably the vacuum pump 146 is a cryopump or any pump capable of sustaining a low pressure of about $10^{-8}$ Torr.

A controller 149 controls the functions of the power supplies, lift motors, mass flow controllers for gas injection, vacuum pump, and other associated chamber components and functions. The controller 149 executes system control software stored in a memory, which in the preferred embodiment is a hard disk drive, and can include analog and digital input/output boards, interface boards and stepper motor controller boards. Optical and/or magnetic sensors are generally used to move and determine the position of movable mechanical assemblies.

In operation, a robot delivers a substrate 110 to the chamber 100 through the opening 108. The pins 120 are extended upward to lift the substrate 110 from the robot. The robot then retracts from the chamber 100 and the opening 108 is sealed. The pins 120 lower the substrate 110 to the upper surface 105 of the substrate support member 112. The substrate support member 112 raises the substrate 110 to engage the clamp ring 128. One or more plasma gases are then introduced into the chamber 100 to stabilize the chamber 100 at a process pressure. A plasma is generated between the target 104 and the substrate support member 112 with power from the first power source 130. The second power source 132 delivers power to the coil 122 to create a plasma sufficiently dense to ionize the flux of sputtered target material from the target 104. The ions are accelerated toward the substrate 110 which is biased by the third power source 134. After deposition, the substrate support member 112 is lowered, the pins 120 are raised to lift the substrate 110, the robot enters the chamber 100 to retrieve the substrate 110, and if desired, delivers another substrate for processing.

The plasma gas, or gases, used to ionize the flux of sputtered target material is selected to have a high molar mass relative to the target material and/or low ionization energies. "High molar mass" refers to the highest possible mass without necessarily being greater than the molar mass of the target material. A "low ionization energy" plasma gas refers to a gas which requires less energy to be ionized relative to conventional plasma gases, in particular Ar and He.

Preferably, the plasma gas is krypton (Kr), xenon (Xe) or a combination thereof. While Kr (molar mass=83.80) and Xe (molar mass=131.30) have molar masses less than Ta (molar mass=180.948) and W (molar mass=183.85), Kr, Xe have molar masses substantially greater than conventional plasma gases such as Ar (molar mass=39.948) and helium (molar mass=4.0026).

Figure 1:
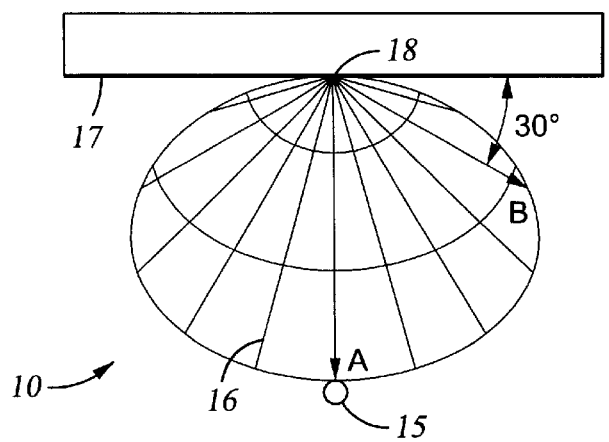
FIG. 1 is a schematic representation of an under-cosine emission profile.
Figure 2:
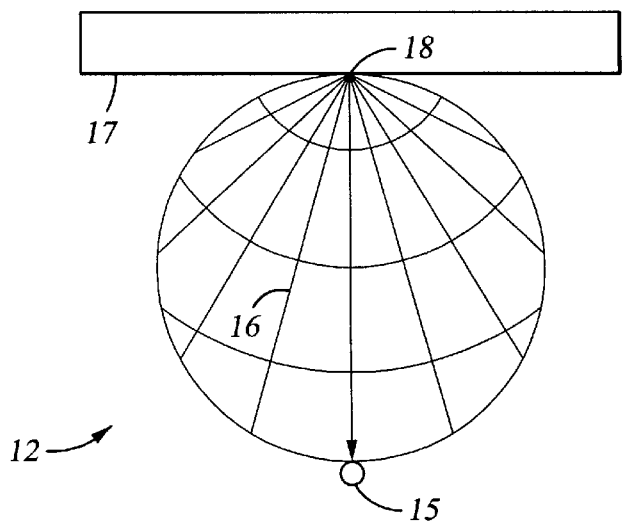
FIG. 2 is a schematic representation of a cosine emission profile.
Figure 3:
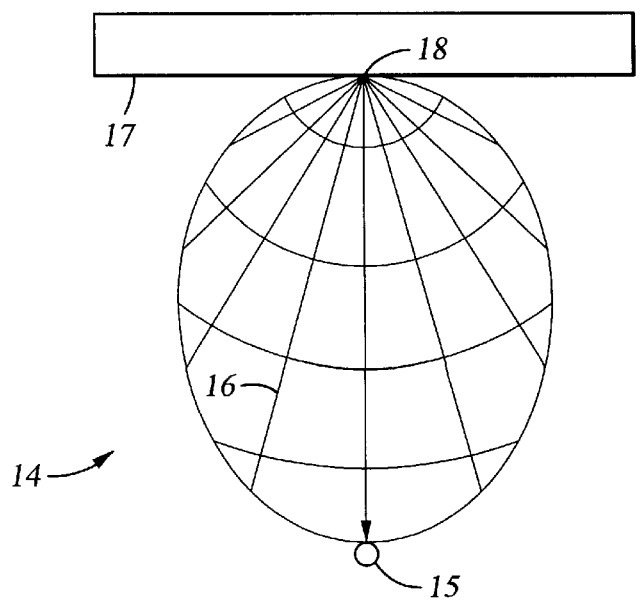
FIG. 3 is a schematic representation of an over-cosine emission profile.

The inventors of the present invention have observed that the directionality of the ejected target particles is determined, in part, by the ratio of the molar mass of the plasma ions to the target material, with the emission profile approaching over-cosine (shown in FIG. 3) as the molar mass of the plasma ions increases relative to the target material. Using Xe and Kr as plasma gases provides a mass ratio sufficiently high to result in an over-cosine emission profile such as the profile 14 shown in FIG. 3. The over-cosine emission profile indicates the probability of target material being ejected from the target 104 at normal or near-normal angles is greater than with under-cosine or cosine emission profiles, shown in FIGS. 1 and 2, respectively. Consequently, the target material provides better coverage of the bottom of substrate features than is achieved with undercosine emission profiles.

Further, because of the higher molar masses of Kr and Xe relative to the target material, fewer collisions with the target material are needed to thermalize and ionize the target material. Thus, the chamber pressure may be lower than is possible with conventional Ar or He IMP-PVD, thereby eliminating or minimizing the disadvantages associated with high pressure PVD processes described above.

Additionally, Xe and Kr have lower ionization energies than conventional plasma gases, in particular Ar and He. Ionization energy refers to the readiness of an atom or molecule to ionize in the presence of an energy field. Particles having a high ionization energy require relatively larger levels of energy to cause ionization as compared to particles having a low ionization energy. While argon, helium and other conventional plasma gases are currently being used because of their low cost, such gases have high ionization energies. The first ionization energies for neutral atoms are as follows: Xe=12.130 eV, Kr=13.99 eV, Ar=15.759 eV and He=24.587 eV. Thus, both Xe and Kr require relatively less energy to be ionized than Ar or He, resulting in a greater percentage of ionization of Xe and Kr at a given coil power setting. Because the plasma constituents are the primary mechanism for ionization of the target material, more of the target material is ionized in a plasma environment comprising Xe, Kr or a combination thereof. Consequently, a higher proportion of target material can be influenced by bias applied to the substrate, thereby allowing more material to be deposited on the bottom of the features formed in the substrate.

The processes of the invention are preferably performed on a substrate having one or more features such as contacts, vias, lines or other interconnect features formed thereon. The interconnect features may be any size and have any aspect ratio, however, the trend has been to decrease feature dimensions and increase aspect ratios. The invention has particular application to high aspect ratio features, e.g., 4:1 or higher having widths of less than about 0.25 $\mu$m wherein conformal step coverage is increasingly more difficult to obtain.

Embodiments of the present invention are described with reference to FIGS. 5–9 which show the deposition of a barrier layer and a seed layer in a via as steps of a copper metallization scheme. Subsequently, the via is filled by electroplating methods. Preferably, the seed layer and the barrier layer are deposited using an IMP chamber such as the chamber 100 described above with reference to FIG. 4. Thus, where necessary, reference is made to the chamber components shown in FIG. 4. The following examples are merely illustrative and are not to be understood as limiting of the present invention.

EXAMPLE

Figure 5:
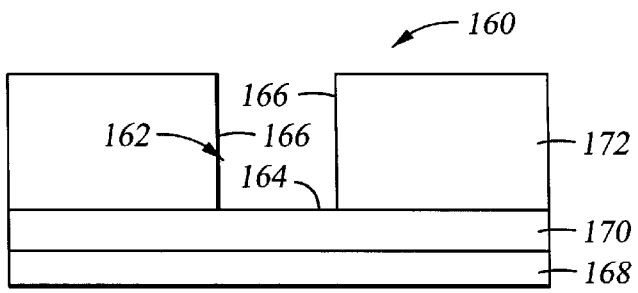
FIG. 5 is a schematic diagram of a semiconductor substrate via formed in a dielectric material.
Figure 6:
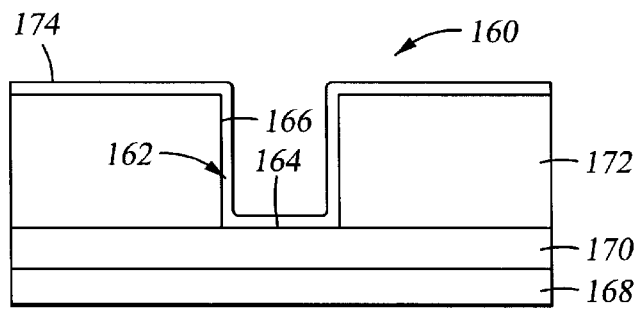
FIG. 6 is a schematic diagram of the semiconductor substrate via of FIG. 5 having a barrier layer formed thereon.

FIG. 5 is a cross-sectional view of a substrate 160 comprising a silicon base 168, a conducting layer 170, and a dielectric layer 172. A via 162 defined by a bottom 164 and side walls 166 is formed in the dielectric layer 172. Initially, the substrate 160 is preferably subjected to a cleaning process such as argon bombardment in a pre-cleaning chamber wherein a portion of the material on the substrate surface is removed to eliminate native oxides or other contaminants from the surface. Subsequently, the substrate 160 is moved into an IMP chamber where a barrier layer 174 is conformally deposited over the bottom 164 and side walls 166 of the substrate 160 as shown in FIG. 6. The barrier layer 174 is used to prevent diffusion of a subsequently deposited material into the dielectric layer 172 and preferably comprises tantalum, tantalum nitride, tungsten, tungsten nitride, titanium nitride or combinations thereof. Thus, the target 104 comprises the desired barrier layer material to be deposited onto the substrate 160. The barrier layer 174 is preferably deposited to a thickness of about 100 Å to about 450 Å. The substrate support member 112 is heated to a temperature of between about 100° C. and 150° C. A plasma gas comprising one or more of Xe and Kr is then introduced into the chamber 100 to stabilize the chamber pressure at between about 20 mTorr and 60 mTorr. Additionally, a concentration of Ar may also be supplied to the chamber to facilitate striking of the plasma. A target bias of about 1 kW to about 5 kW and a coil RF power of about 1 kW to about 5 kW are delivered to the target 104 and coil 122, respectively. A 13.56 MHz bias of about 0–450 W is applied to the substrate 160.

EXAMPLE

Figure 7:
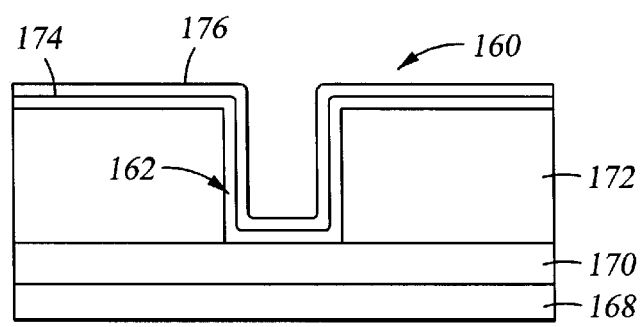
FIG. 7 is a schematic diagram of the semiconductor substrate via of FIG. 6 having a seed layer formed thereon.

A seed layer may be deposited in a via according to the present invention to facilitate subsequent processes wherein the via is filled with a conducting material. Seed layers are typically used to provide a conducting surface for a chemical vapor deposition (CVD) process and/or an electroplating processes. Preferably, the barrier layer 174 is first deposited on the via sidewalls and floor to prevent the seed layer and subsequent fill material from diffusing into the underlying dielectric layer. FIG. 7 shows the substrate 160 of FIGS. 5 and 6 having barrier layer 174 deposited in a via 162 according to the process described above. The seed layer 176 then forms a conformal layer over the barrier layer 174. Preferably, the barrier layer 174 and seed layer 176 are deposited in an integrated system without moving the substrate 160 into an ambient environment between deposition steps, thereby providing good adhesion between the barrier layer 174 and the seed layer 176. In addition, good film texture of the seed layer 176 results. Thus, the substrate 160 is preferably transferred under vacuum conditions to another IMP chamber having a target 104 comprising the seed layer material. Preferably the seed layer 176 comprises copper. The seed layer 176 is deposited to a thickness of about 100 Å to about 450 Å. The substrate support member 112 is heated to a temperature of between about −40° C. and 25° C. A plasma gas is then introduced into the chamber 100 to stabilize the chamber pressure at between about 20 mTorr and 60 mTorr. A target bias of about 1 kW to about 5 kW and a coil RF power of about 1 kW to about 5 kW are delivered to the target 104 and coil 122, respectively. A 13.56 MHz bias of about 0–450 W is applied to the substrate 160.

EXAMPLE

Figure 8:
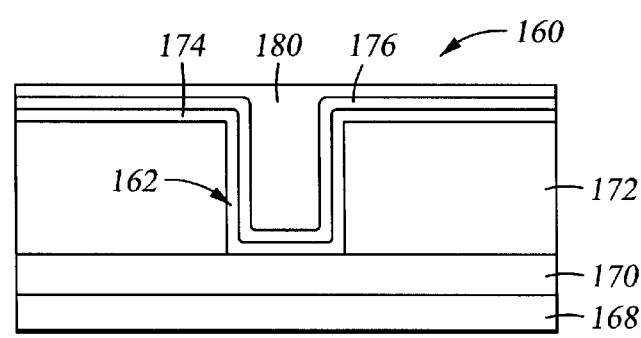
FIG. 8 is a schematic diagram of the semiconductor substrate via of FIG. 7 having a conductive material deposited therein to fill the via.
Figure 9:
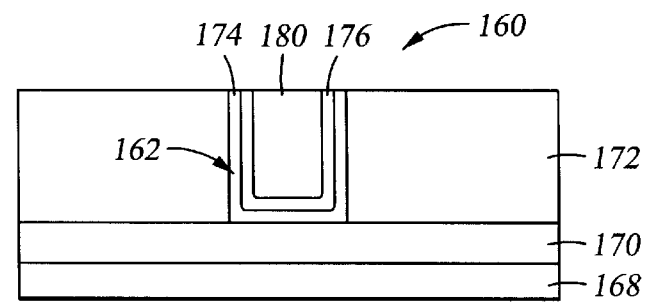
FIG. 9 is a schematic diagram of the semiconductor substrate via of FIG. 8 after planarization.

Subsequent to depositing a barrier layer and a seed layer according to the process described above with reference to FIGS. 5–7, the via 162 is filled with a conductive material 180 as shown in FIG. 8. The conductive material 180 is preferably copper and may be deposited according to methods known in the art such as electroplating and chemical vapor deposition. In the case of electroplating the substrate is preferably placed in a process cell and exposed to an electrolytic solution. A power source is coupled to the conducting seed layer in order to attract ions from the solution. The ions are caused to deposit on the seed layer and fill the via 162 as shown in FIG. 8. After the via 162 is filled, the substrate 160 is transferred to a polishing chamber, such as a chemical mechanical polishing chamber, where the excess material is removed from the substrate 160 and the via 162 is planarized as shown in FIG. 9.

While the foregoing is directed to the preferred embodiment of the present invention, other and further embodiments of the invention may be devised without departing from the basic scope thereof, and the scope thereof is determined by the claims that follow.

What is claimed is:

1. A method for depositing one or more layers on a substrate, comprising:

(a) positioning the substrate on a first support member in a first chamber;

(b) introducing one or more plasma gases into the first chamber selected from xenon, krypton or a combination thereof;

(c) supplying a first power to a first coil positioned to inductively couple energy into the first chamber;

(d) supplying a second power to the first support member;

(e) sputtering a first material from a first target onto the substrate to form a barrier layer thereon, wherein the first material is selected from tantalum, tantalum nitride, tungsten, tungsten nitride, titanium nitride and a combination thereof; and then (f) depositing a seed layer on the barrier layer.

2. The method of claim 1, wherein (e) and (f) are performed at a pressure between about 20 mTorr and 60 mTorr.

3. The method of claim 1, wherein the barrier layer is deposited on a dielectric material disposed on the substrate.

4. The method of claim 1, wherein the first power is between about 1 kW and 5 kW.

5. The method of claim 1, wherein (f) comprises:

(i) positioning the substrate on a second support member in a second chamber having a second target disposed therein, the second target comprising a second material;

(ii) introducing one or more plasma gases into the second chamber selected from xenon, krypton or a combination thereof;

(iii) supplying a third power to a second coil positioned to inductively couple energy into the second chamber;

(iv) supplying a fourth power to the second support member; and (v) sputtering the second material onto the substrate to form the seed layer thereon.

6. The method of claim 5, wherein (e) and (f)(v) are performed at a pressure between about 20 mTorr and 60 mTorr.

7. The method of claim 5, wherein the third power is between about 1 kW and 5 kW.

8. The method of claim 5, wherein the fourth power is equal to or less than about 450 W.

9. The method of claim 5, wherein the second material is selected from copper, tantalum, tantalum nitride, tungsten, tungsten nitride, titanium nitride and a combination thereof.

10. The method of claim 5, wherein the first and third powers are between about 1 kW and 5 kW, the second and fourth powers are equal to or less than about 450 W, and the second material is selected from copper, tantalum, tantalum nitride, tungsten, tungsten nitride, titanium nitride and a combination thereof.

* * * * *